United States Patent [19]
Chen et al.

[11] Patent Number: 6,016,002
[45] Date of Patent: Jan. 18, 2000

[54] STACKED SILICON-CONTROLLED RECTIFIER HAVING A LOW VOLTAGE TRIGGER AND ADJUSTABLE HOLDING VOLTAGE FOR ESD PROTECTION

[75] Inventors: Julian Zhiliang Chen, Dallas; Thomas A. Vrotsos, Richardson; Wayne T. Chen, Plano, all of Tex.

[73] Assignee: Texas Instruments Incorporated, Dallas, Tex.

[21] Appl. No.: 08/993,820

[22] Filed: Dec. 18, 1997

Related U.S. Application Data

[60] Provisional application No. 60/033,542, Dec. 20, 1996.

[51] Int. Cl.[7] .......................... H01L 23/62; H01L 29/00; H01L 29/74; H01L 31/111
[52] U.S. Cl. ............................ 257/546; 257/173; 257/355
[58] Field of Search ................................... 257/146, 147, 257/173, 174, 355, 546; 361/100

[56] References Cited

U.S. PATENT DOCUMENTS

| | | | |
|---|---|---|---|
| 5,359,211 | 10/1994 | Croft | 257/173 |
| 5,465,189 | 11/1995 | Polgreen et al. | 257/355 |
| 5,576,557 | 11/1996 | Ker et al. | 257/173 |
| 5,670,799 | 9/1997 | Croft | 257/173 |
| 5,719,733 | 2/1998 | Wei et al. | 257/173 |
| 5,742,085 | 4/1998 | Yu | 257/146 |

*Primary Examiner*—Mahshid Saadat
*Assistant Examiner*—Jesse A. Fenty
*Attorney, Agent, or Firm*—Jacqueline J. Garner; Wade James Brady; Richard L. Donaldson

[57] ABSTRACT

An SCR (68) for protecting an integrated circuit (62) against ESD events is provided having a trigger voltage which is automatically adjusted to different trigger voltage levels in response to power being applied to the integrated circuit (62). An enhancement-type P-channel transistor (78) is provided for determining the trigger voltage. When operating power is not being applied to the integrated circuit (62), the P-channel transistor (78) threshold voltage determines the voltage at which the SCR (68) is triggered. When operating power is being applied to the integrated circuit (62), the operating voltage is applied to the gate of the P-channel transistor (78), and then the operating voltage and the threshold voltage for the P-channel transistor (78) determine the trigger voltage of the SCR (68). Then, a PNP and NPN transistor pair (76, 80) that form the SCR (68) are latched to shunt the protected signal path (69) to ground. The SCR (68) remains latched until the voltage applied to the signal path (69) falls beneath a holding voltage of the SCR (68). A plurality of the SCRs (126, 128) may be connected in series, such that the overall holding voltage for the series of SCRs (126, 128) is approximately equal to the sum of the individual holding voltages for the SCRs (126, 128), which overall holding voltage is greater than the trigger voltage. Preferably, the SCR (68) is isolated from the P substrate (92) by a P-N junction which is provided by disposing the SCR (68) within an N-tank (98).

6 Claims, 4 Drawing Sheets

STACKED SILICON-CONTROLLED RECTIFIER HAVING A LOW VOLTAGE TRIGGER AND ADJUSTABLE HOLDING VOLTAGE FOR ESD PROTECTION

This application claims priority under 35 USC § 119(e)(1) of provisional application Ser. No. 60/033,542 filed Dec. 20, 1996.

TECHNICAL FIELD OF THE INVENTION

The present invention pertains in general to electrostatic discharge protection circuits and, more particularly, to an electrostatic discharge protection circuit included within an integrated circuit for shunting a signal line to ground.

BACKGROUND OF THE INVENTION

Integrated circuits are particularly sensitive to the high voltages encountered as a result of electrostatic discharge (ESD) events, such as may occur when a person touches a lead of an integrated circuit. Prior art silicon-controlled rectifiers (SCRs) have been provided for selectively discharging to ground the high voltages of ESD events Prior to an ESD event, the SCR is in a nonconductive state. Once the high voltage of an ESD event is encountered, the SCR then changes to a conductive state to shunt the current to ground and maintains this conductive state until the voltage is discharged to a safe level.

A problem arises due to the holding voltage of prior art SCRs being lower than the operating voltage at which the protected circuit operates. Thus, a prior art SCR may be triggered by an ESD event or large signal noise and remain latched in a conductive state as long as the operating voltage is applied to the particular circuit being protected. The problem occurs since spurious noise generated when an integrated circuit is operated may activate a sensitive SCR circuit unless, as is currently done in the prior art. This can damage the SCR. Also, the protected circuit cannot be used until the operating voltage is removed from the protected circuit such that the SCR can return to an unlatched, nonconductive state.

A further problem occurs with the reduction in size of integrated circuits, in that the reduced scale of the circuits results in greater sensitivity and susceptibility to damage from ESD events. This is especially true for MOSFET circuits which presently operate at voltage levels of 3.3 volts. MOSFET circuits are easily damaged by ESD events. In order to protect such circuits against ESD events, sensitive SCR circuits must be utilized. Due to the high trigger voltage of an SCR, a resistor must be placed on the signal line being protected. This resistor also adds a time constant, causing a lag in response time of the signal line and distortion of digital signals at high frequencies.

SUMMARY OF THE INVENTION

The present invention disclosed and claimed herein comprises an SCR having a trigger voltage which is automatically adjusted to different trigger voltage levels in response to power being applied to the integrated circuit. A P-channel transistor is provided for determining the trigger voltage. When operating power is not applied to the integrated circuit being protected, the P-channel transistor threshold voltage determines the voltage at which the SCR is triggered. When operating power is applied to the integrated circuit being protected, the operating voltage is applied to the gate of the P-channel transistor, and the operating voltage of the integrated circuit and the threshold voltage of the P-channel transistor determine the trigger voltage of the SCR. Then a PNP and NPN transistor pair are latched to shunt the protected signal path to ground. The SCR remains latched until the voltage applied to the signal path falls beneath the threshold voltage of the SCR.

In another aspect of the present invention, a plurality of SCRs may be stacked, or connected in series, such that the cumulative holding voltages of the SCRs are greater than the operating voltage applied to the signal path. The SCRs are stacked in series, such that the overall holding voltage for the series of SCRs is approximately equal to the sum of the individual holding voltages for the SCRs and is greater than the trigger voltage.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
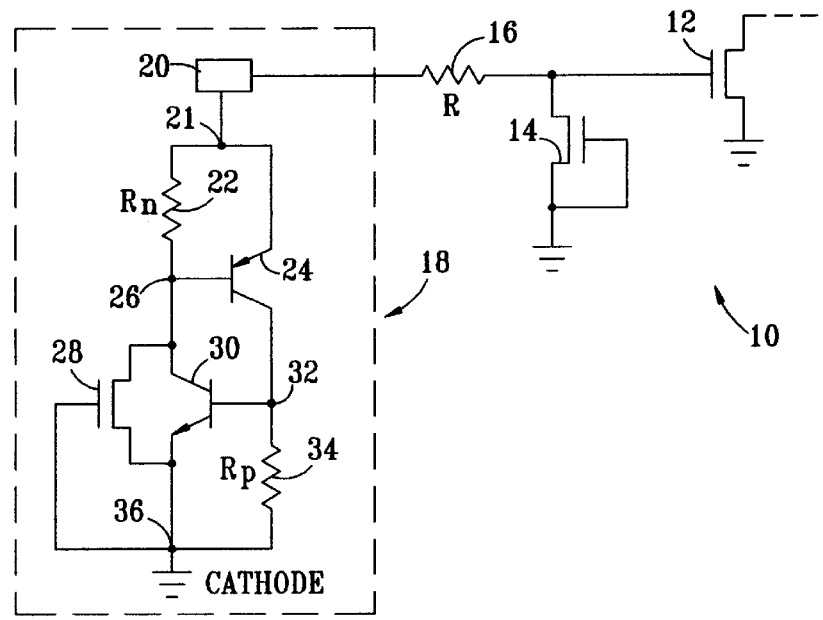
FIG. 1 illustrates a schematic diagram of a prior art SCR included within an integrated circuit to provide ESD protection.

Referring now to FIG. 1, there is illustrated a schematic diagram of a prior art integrated circuit 10 having protected circuitry 12. The circuitry 12 is protected by a diode connected N-channel transistor 14 having the drain connected to the gate of transistor 12 and the source thereof connected to ground, such that voltages in excess of the breakdown voltage of the transistor 14 will cause it to conduct. A resistor 16 is connected between the gate of transistor 12 and an input pad 20. An SCR 18 is connected from the pad 20 to ground. The SCR 18 includes an anode 21 that is connected to the pad 20, which anode 21 is connected to one side of a resistor 22 and the emitter of a PNP transistor 24. The base of the transistor 24 is connected to a node 26. The other side of resistor 22 is connected to the node 26. The drain of an N-channel transistor 28 and the collector of an NPN transistor 30 are both connected to the node 26. The base of the transistor 30 is connected to a node 32, which is connected to the collector of the transistor 24 and to one side of a resistor 34. The other side of resistor 34 is connected to a node 36, this being the cathode which is connected to ground. The emitter of the transistor 30, and the gate and the source of the N-channel transistor 28 are connected to the node 36.

Figure 2:
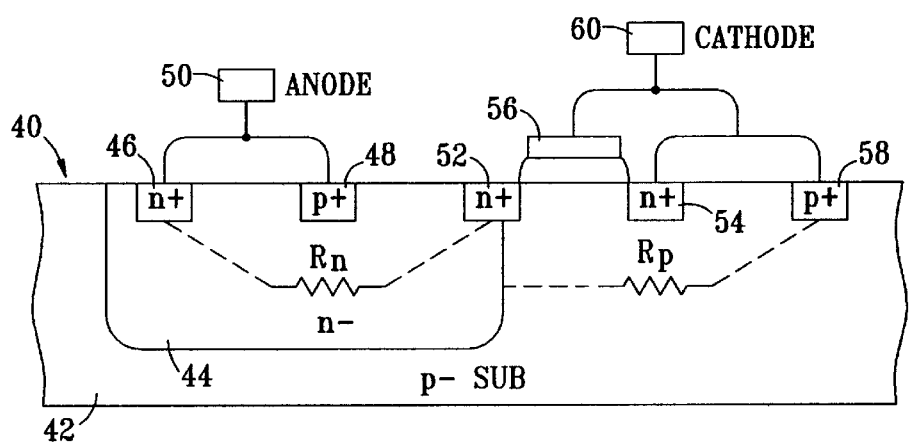
FIG. 2 illustrates a sectional view of a prior art integrated circuit which provides the SCR as depicted in FIG. 1.

Referring now to FIG. 2, there is illustrated a sectional view of an integrated circuit 40 which provides the circuitry of the SCR 18 depicted in FIG. 1. Integrated circuit 40 includes a P-type substrate 42 into which an N-well 44 is formed. Within the N-well 44, an N+ region 46 and a P+ region 48 are formed. The N+ region 46 and the P+ region 48 are together connected to a terminal pad 50, which provides the equivalent of the anode 21 of FIG. 1. An N+ region 52 is provided such that it is disposed across the junction of the N-well 44 and the substrate 42 as shown. An N+ region 54 is formed into the substrate 42, spaced apart from N+ region 52. An N-channel transistor is provided by disposing a gate 56 adjacent to a portion of the substrate 42 which extends between the N+ region 52 and the N+ region 54, these forming the source/drain regions thereof. A P+ region 58 is formed into the substrate 42 and connected to a terminal pad 60. The N+ region 54 and the gate 56 are also directly connected to the terminal pad 60. The terminal pad 60 provides the node 36 of FIG. 1.

Referring further to FIGS. 1 and 2, the resistor 22 of resistance $R_N$ is provided by a portion of the N-well 44 which extends from the N+ region 46 to the interface of the N-well 44 and the substrate 42. The N+ region 46 is spaced apart from the N+ region 52 such that a portion of the N-well 44 which extends between the N+ region 46 and the N+ region 52 provides the resistor 22 of resistance $R_N$. The terminal pad 50 is also connected to the P+ region 48. The region of the substrate 42 extending from the junction with the N-well 44 to the P+ region 58 provides the resistor 34 of resistance $R_P$. The PNP transistor 24 has an emitter provided by the P+ region 48, a base provided by the N-well 44, and a collector provided by the P-substrate 42. The N+ region 52 provides the drain for the N-channel transistor 28. The gate and the source of the N-channel transistor 28 are provided by the gate 56 and the N+ region 54, respectively. The NPN transistor 30 has the collector thereof provided by the N-well 44, the base thereof provided by the substrate 42, and the emitter thereof provided by the N+ region 54.

In operation, the protective circuit 18 will not conduct current between the anode 21 and the cathode 36 until a voltage builds up at the node 26 which exceeds the breakdown voltage of the transistor 28. The breakdown voltage preferably ranges 7 to 10 volts for 3.3 V operation technology and from 10.0 to 15.0 volts for 5 V operation technology. Once the breakdown voltage of the transistor 28 is exceeded, current will flow through resistor 22 to the node 26, and from the drain to the source of the transistor 28. Current through the resistor 22 will cause the voltage on the base of the PNP transistor 24 to drop. Once the diode voltage of the transistor 24 is exceeded, with a forward bias, it will conduct current from the anode 21 to the node 32. Current through resistor 34 to the node 36 will cause the voltage on the base of transmitter 30 to rise and turn on transistor 30. Current passing through the transistor 30 causes current to pass through the resistor 22 further lowering the voltage on node 26 below the breakdown voltage of transistor 28. Thus, the transistors 24 and 30 will latch in conductive modes until the voltage across either of resistors 22 and 34 falls beneath a holding voltage for the SCR 18.

The prior art protective circuitry of the SCR 18 has a singular trigger voltage, which is determined by the breakdown voltage of the transistor 28. The holding voltage for the prior art SCR 18 is typically less than the power supply voltage of the protected circuitry 12, resulting in the SCR 18 latching in a conductive mode until operating power is removed from the signal line being protected. For example. For a 3.3 volt technology, the holding voltage is approximately 1.5 volts.

Figure 3:
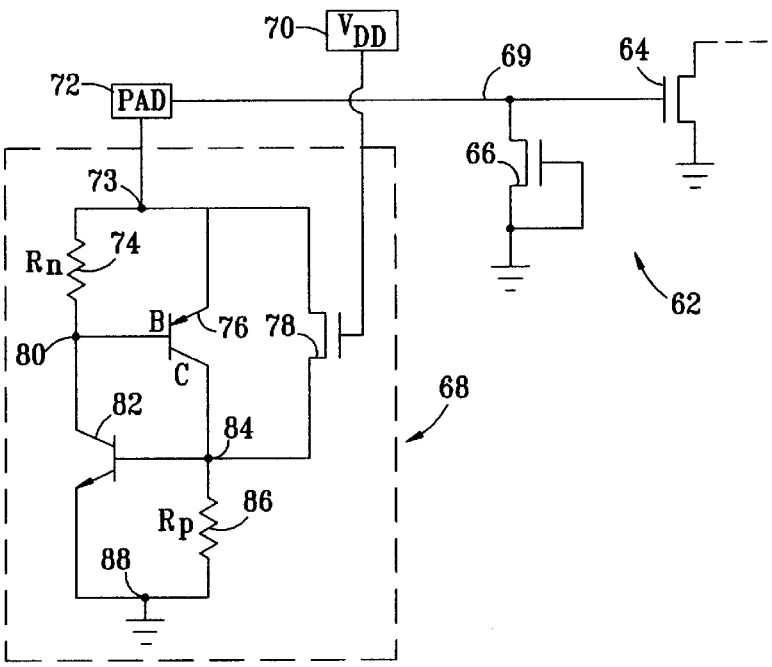
FIG. 3 illustrates a schematic diagram of an ESD protection circuit which comprises an SCR of the present invention.

FIG. 3 illustrates a schematic diagram of an integrated circuit 62, which has protected circuitry 64 in the form of an MOS transistor and an N-channel transistor 66 connected between the pad 72 and ground. Protective circuitry is provided by an SCR 68 connected between the pad 72 and ground. The SCR 68 has an operating voltage terminal pad 70 connected to $V_{DD}$, the power supplied to the integrated circuit 62, although it could be connected to another voltage level. The circuitry of the SCR 68 further includes an anode 73 which is connected to one side of a resistor 74, to the emitter of a PNP transistor 76 and to the source of a P-channel transistor 78. The gate of the transistor 78 is connected directly to the terminal pad 70, which is connected to $V_{DD}$. The other side of resistor 74 is connected to a node 80. The node 80 is connected to the base of the transistor 76 and the collector of an NPN transistor 82. The base of the transistor 82 is connected directly to a node 84. The collector of the transistor 76 and the drain of the transistor 78 are also connected directly to a node 84. A resistor 86 is connected between the node 84 and a node 88. The node 88 provides the cathode of the SCR 68 which is connected to ground. The emitter of the NPN transistor 82 is also connected to the node 88.

Figure 4:
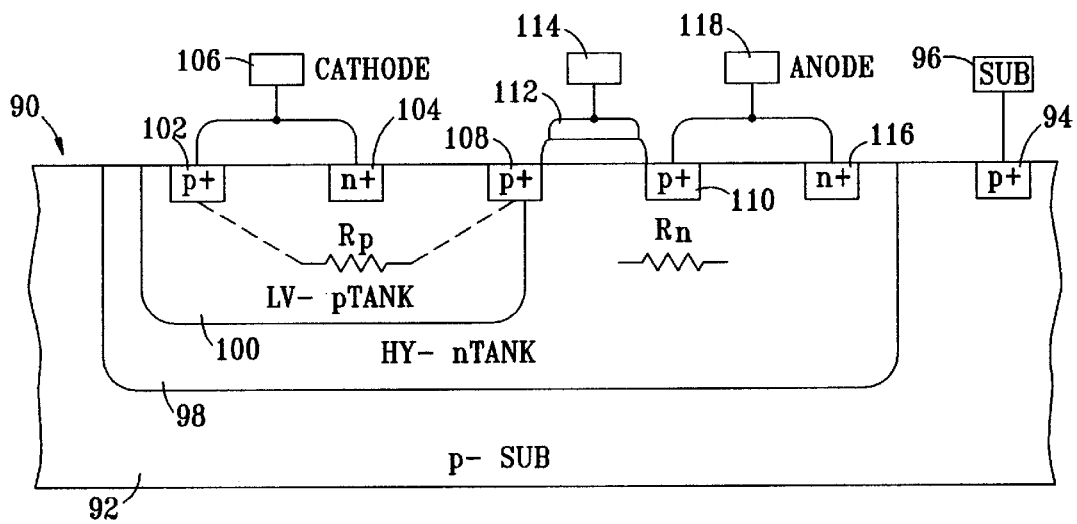
FIG. 4 illustrates a sectional view of an integrated circuit which includes the ESD protection circuit which is schematically depicted in FIG. 3.

Referring now to FIG. 4, there is illustrated a sectional view of an integrated circuit 90 which provides the circuitry of the SCR 68 depicted in FIG. 3. The integrated circuit 90 includes a P-type substrate 92. A high voltage N-tank (HV-ntank) 98 is formed in the substrate 92. Also formed in substrate 92 is a P+ region 94 which is connected to a substrate terminal pad 96 for providing an electrical connection to the substrate 92. A low voltage P-tank (LV-ptank) 100 is formed in the HV-ntank 98. A P+ region 102 is formed in the LV-ptank 100. An N+ region 104 is also formed into the LV-ptank 100. The P+ region 102 and the N+ region 104 are both connected to a cathode 106. A P+ region 108 extends between the HV-ntank 98 and the LV-ptank 100. A P+ region 110 is formed in the HV-ntank 98, spaced apart from the P+ region 108 to provide the source/drain regions of a P-channel transistor separated by a channel region over which a gate electrode 112 is disposed and separated therefrom by a layer of gate oxide. The gate 112 is connected to a terminal pad 114. An N+ region 116 is formed into the HV-ntank 98 and, along with the P+ region 110, is connected to an anode 118. It should be noted that the resistivity of the HV-ntank 98 is such that it will provide a resistance of $R_N$ in the portion thereof between the LV-ptank 100 and the N+ region 116. Additionally, the resistivity of the LV-ptank 100 is such that it will provide a resistance $R_P$ in the portion thereof extending between the P+ region 102 and both the P+ region 108 and the HV-ntank 98. The HV-ntank 98 will also isolate the SCR 68 from the substrate 92.

Referring now to FIGS. 3 and 4, the anode 73 of FIG. 3 corresponds to the terminal pad 118 of FIG. 4, providing the anode for the SCR 68. A portion of the HV-ntank 98 which extends from the N+ region 116 to the LV-ptank 100 has a resistivity such that it provides the resistor 74 of resistance Rn. The emitter, the base and the collector of the transistor 76 are provided by the P+ region 110, the HV-ntank 98, and the LV-ptank 100, respectively. The P+ regions 108 and 110 and the gate 112 together provide the transistor 78. The terminal pad 114 connects the gate 112 to $V_{DD}$ and corresponds to the terminal pad 70. The P+ region 110 corresponds to the source and the P+ region 108 corresponds to the drain of transistor 78. The collector, the base, and the emitter of the transistor 82 are provided by the HV-ntank 98, the LV-ptank 100 and the N+ region 104, respectively. The portion of the LV-ptank 100 which extends from the P+ region 108 and the HV-ntank 98 to the P+ region 102 provides the resistor 86 of a resistance $R_P$. The node 106 corresponds to the node 88 and provides the cathode for SCR 68.

The SCR 68 protects the circuit 64 against ESD events. It should be noted that the resistor 16, which is included between SCR 18 and protected circuitry 12 of FIG. 1, is not included within the circuitry depicted in FIG. 3.

In operation, there are two conditions to consider, a power-down operation and a power-up operation. In the power-down operation, the voltage $V_{DD}$ on pad 70 will be virtually grounded. Since the voltage is disposed at ground, any positive voltage on the drain of transistor 78 above one threshold voltage $V_T$ thereof, which is connected to the anode 73 of the SCR 68, will turn on transistor 78 and conduct current to resistor 86. When this voltage is sufficient to turn on transistor 82, current will flow through resistor 74 to pull node 80 down and turn on transistor 76, thus latching the SCR 68. Alternatively, in the power-up condition, the pad 72 is raised to $V_{DD}$ which is, in the preferred embodiment, 3.3 volts (or 5.0 volts in other applications). When the voltage on the input terminal pad 72 is raised up to a voltage that is one threshold voltage $V_T$ above the supply voltage that is on the gate of transistor 78, transistor 78 will conduct and current will flow to resistor 86. This will turn on transistor 82, pulling node 80 low and turning on transistor 76, thus activating the SCR 68 and pulling the voltage on pad 70 low. Once the voltage on the anode 73 is pulled low, transistor 78 will turn off, due to its source falling below one $V_T$ above the gate voltage, $V_{DD}$. When the voltage on the anode falls to a level below the holding voltage, then the latch will again turn off. In the preferred embodiment, this voltage is approximately 1.2 volts. Therefore, with the use of the transistor 78 with the gate thereof connected to the supply voltage on the pad 70, a lower trigger voltage has been realized and no series resistor is required. Further, by isolating the SCR in a high voltage tank, substrate current injection is reduced. This is due to the fact that there is a reverse biased PN junction between the high voltage tank and the substrate, which substrate is a P-type material. Since the high voltage tank provides the base for the PNP transistor at the node 80, this substrate current injection could effect the operation of the SCR.

Figure 5:
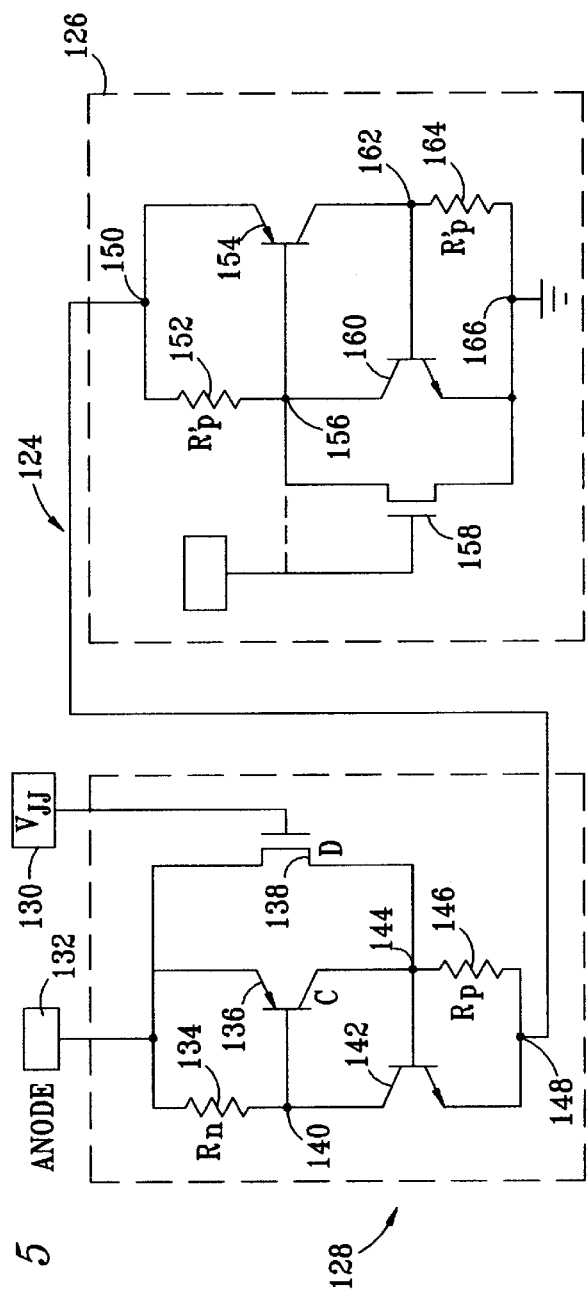
FIG. 5 illustrates a schematic diagram of an ESD protection circuit of an alternative embodiment of the present invention, which comprises two SCRs connected together in series.

Referring now to FIG. 5, there is illustrated a protective circuit 124 which is comprised of the series combination of an SCR 126 and an SCR 128. The SCR 128 is similar to the SCR 68 of FIG. 3. The circuitry of the SCR 128 includes an operating voltage terminal pad 130 which is connected to the operating voltage $V_{DD}$ of the integrated circuit within which the protective circuit 124 is included. An anode is provided by a terminal pad 132, the anode. A resistor 134 connects from the terminal pad 132 to a node 140. A PNP-bipolar transistor 136 has the emitter thereof connected to the anode 132, the collector thereof connected to a node 144, and the base thereof connected to the node 140. A P-channel transistor 138 has the source thereof connected to the anode 132, and the drain thereof connected to the node 144. The gate of the transistor 138 is connected to the terminal pad 130, which is connected to the operating voltage $V_{DD}$. An NPN transistor 142 has the collector thereof connected to the node 140, the base thereof connected to the node 144, and the emitter thereof connected to the node 148. A resistor 146 of resistance $R_P$ is connected between the node 144 and the node 148. A resistor 134 of resistance $R_N$ is connected between the terminal pad 132 and the node 140.

The node 148 of the SCR 128 is connected to a node 150 of the SCR 126. A resistor 152 of resistance $R_N'$ is connected between a node 150 and a node 156. A PNP transistor 154 has the emitter thereof connected to the node 150, the base thereof connected to the node 156, and the collector thereof connected to a node 162. An NPN transistor 160 has the collector thereof connected to the node 156, the base thereof connected to the node 162, and the emitter thereof connected to a node 166. A resistor 164 of resistance $R_P'$ is connected between the node 162 and the node 166. An N-channel transistor 158 has the drain and the gate thereof connected to the node 156 and the source thereof connected to the node 166. A resistor 164 of resistance $R_P'$ is connected between the node 162 and the node 166.

Figure 6:
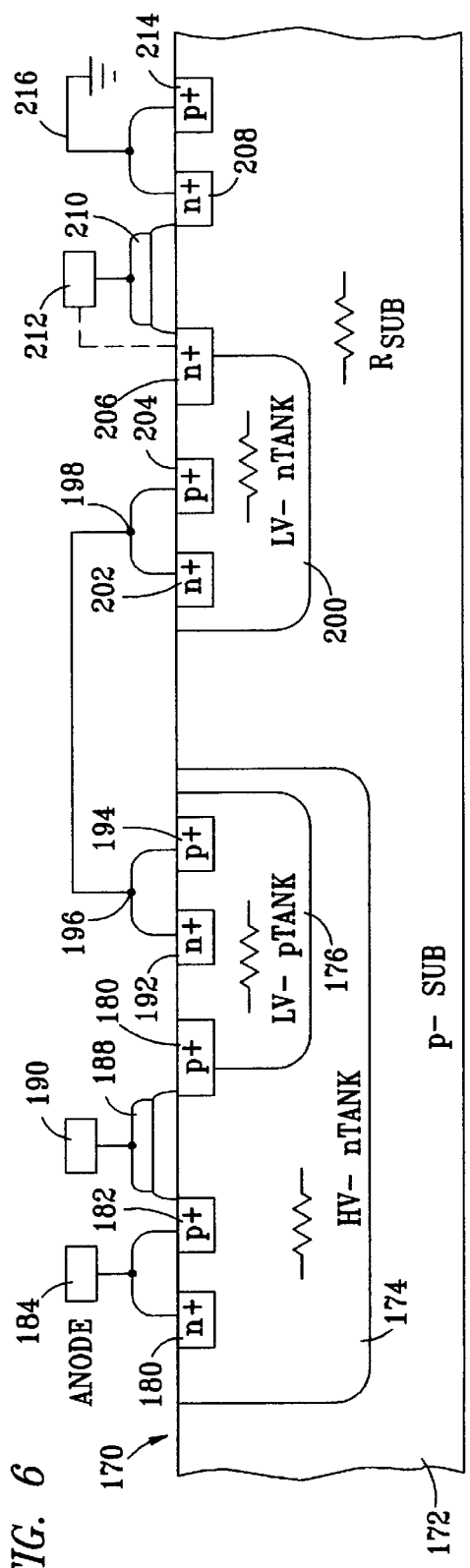
FIG. 6 illustrates a sectional view of an integrated circuit which includes the ESD protection circuit of FIG. 5.

Referring now to FIG. 6, there is illustrated a sectional view of an integrated circuit 170 which provides the protective circuit 124 depicted in FIG. 5. The integrated circuit 170 includes a P-type substrate 172. A high voltage N-tank (HV-ntank) 174 is formed into the substrate 172. A low voltage P-tank (LV-ptank) 176 is formed into the HV-ntank 174. An N+ region 180 and a P+ region 182 are formed into the HV-ntank 174, and are both connected to a terminal pad 184, which provides an anode. A P+ region 186 is formed across the junction between the HV-ntank 174 and the LV-ptank 176. The P+ region 182, the P+ region 186 and a gate electrode 188 together define a P-channel transistor in the HV-ntank 174. The gate electrode 188 is connected to a terminal pad 190. An N+ region 192 and a P+ region 194 are formed into the LV-ptank 176. The N+ region 192 and the P+ region 194 are both connected to a node 196, which is connected to a node 198.

A low voltage-N tank (LV-ntank) region 200 is formed into the substrate 172. An N+ region 202 and a P+ region 204 are formed into the LV-ntank 200. The N+ region 202 and the P+ region 204 are both connected to the node 198. An N+ region 206 is formed across the junction between the substrate 172 and the LV-ntank region 200. An N+ region 208 is formed into the substrate 172, and together with a gate electrode 210 and the N+ region 206 provides an N-channel transistor. The gate electrode 210 is connected to a terminal pad 212, which in turn is tied to the N+ region 206. A P+ region 214 is formed into the substrate 172. The P+ region 214 and the N+ region 208 are connected to a node 216.

Referring now to FIGS. 5 and 6, the terminal pad 184 of the integrated circuit 170 corresponds to the terminal pad 132 of the SCR 128, and provides the anode for the protective circuit 124. The PNP transistor 136 is provided by the P+ region 182, the HV-ntank 174, and the LV-ptank 176. The P-channel transistor 138 is provided by the P+ region 182, the gate electrode 188, and the P+ region 186. The resistor 134 of resistance $R_N$ is provided by the portion of HV-ntank 174 which extends from the N+ region 180 to the LV-ptank 176. The NPN transistor 142 is provided by the HV-ntank 174, the LV-ptank 176, and the N+ region 192. The resistor 146 of resistance $R_P$ is provided by a portion of the LV-ptank 176 which extends from the HV-ntank 174 to the P+ region 194. The node 196 of FIG. 6 corresponds to the node 148 of FIG. 5. The diode junction between the HV-ntank 174 and the substrate 172 isolates the SCR 128 from the substrate 172.

The SCR 126 has a node 150 which corresponds to the terminal pad 198 of the integrated circuit 170. The PNP transistor 154 has the emitter, the base and collector provided by the P+ region 204, the LV-ntank 200 and the substrate 172, respectively. The resistor 152 of resistance $R_N'$ is provided by a portion of the LV-ntank 200, which extends from the N+ region 202 to a portion of the junction between the LV-ntank 200 and the substrate 172. The drain, the gate, and the source of the N-channel transistor 158 correspond to the N+ region 206, the gate electrode 210 and the N+ region 208, respectively. The collector, base, and emitter of the NPN transistor 160 correspond to the LV-ntank 200, the substrate 172, and the N+ region 208, respectively. The resistor 164 of resistance $R_P'$ corresponds to a portion of the substrate 172, which extends from the LV-ntank 200 to the P+ region 214. The terminal pad 216 of the integrated circuit 170 corresponds to the node 166 of the SCR 126.

In operation, the protective circuit 124 may be attached to an input pad to be protected as depicted for the SCR 68 in FIG. 3. The operating voltage $V_{DD}$ of the integrated circuit 170 will preferably be connected to the operating voltage terminal pad 130 of the protective circuit 124, although it can be connected to another voltage different than the operating voltage. The terminal pad 132 will be connected to a signal line of a circuit to be protected against damage by the high voltage of ESD events. When the voltage $V_{DD}$ is not applied to the terminal pad 130 in a power-down condition, the SCR 128 will be triggered by a voltage which exceeds the threshold voltage $V_T$ of transistor 138. When the voltage $V_{DD}$ is applied to the integrated circuit 172, the voltage $V_{DD}$ will be applied to the terminal pad 130. Then, the SCR 128 will be triggered by a voltage applied to the terminal pad 132 which exceeds the voltage $V_{DD}$ applied to the terminal pad 130 by one threshold voltage $V_T$. Current will then flow through the P-channel transistor 138 to the node 144 and then through the resistor 146 to the node 148.

When the voltage on the anode 132 exceeds the voltage on the gate of transistor 138 by more than one threshold voltage, current will flow through resistor 146. Since the second SCR 126 is connected between node 148 and ground, current will then flow through resistor 152 to node 156 and through transistor 158. This will pull the base of transistor 154 low, turning on transistor 154 and passing current through resistor 164. Node 162 will rise, turning on transistor 160 and thereby latching SCR 126 and pulling node 148 to ground. This will in turn cause current to flow through resistor 146 at such a level that transistor 142 will be turned on, pulling node 140 low and turning on transistor 136 and causing SCR 128 to latch.

With the two series connected SCRs 128 and 126, control therefor is provided by the trigger voltage of the SCR 128, i.e., the trigger voltage is one threshold above the supply voltage or whatever voltage is connected to the pad 130. However, the holding voltage is the sum of the two holding voltage for the SCR 128 and the holding voltage for the SCR 126. As such, the holding voltage can exceed the power supply voltage. For example, a 3.3 volt technology part would have two stacked SCRs, each with a holding voltage of approximately 1.75 volts for a combined holding voltage of 3.5 volts, greater than the power supply voltage. Further, the holding voltage can be designed to be greater than the trigger voltage of the power supply voltage plus $V_T$. The holding voltage is a function of the β of the NPN and PNP transistors, this being a function of the product of the βs, f(β*β).

Figure 7:
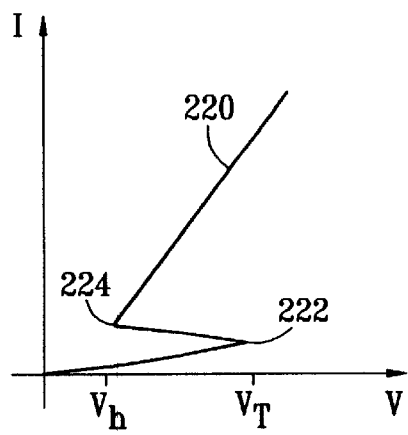
FIGS. 7, 8 and 9 illustrate plots of current versus voltage for the various ESD protection circuits of FIGS. 1–6.
Figure 8:
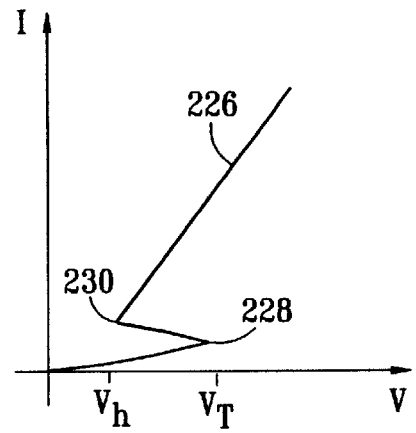
Figure 9:
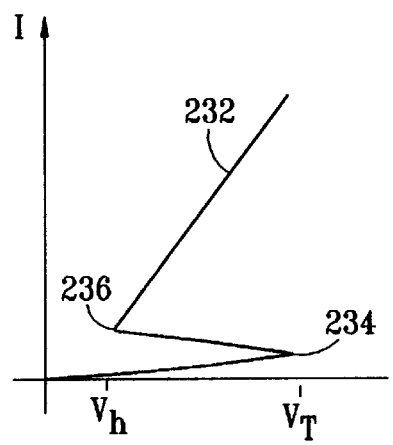

Referring now to FIGS. 7, 8 and 9, there are illustrated graphs of current versus voltage for the SCR 128, the SCR 126, and the protective circuit 124, respectively. A curve 220 depicts a trigger voltage ($V_{TR}$) for the SCR 128 as being at a point 222. The holding voltage ($V_h$) for the SCR 128 is depicted at a point 224. The curve 226 depicts the trigger voltage ($V_{TR}$) for the SCR 126 as being at a point 228 and the holding voltage ($V_h$) for the SCR 126 as being at a point 230. Lastly, the curve 232 depicts the trigger voltage ($V_{TR}$) and the holding voltage ($V_h$) for the protective circuit 124 as being at points 234 and 236, respectively. As discussed above, the protective circuit 124 comprises the SCR 128 connected in series with the SCR 126. The $V_{TR}$ for the protective circuit 124 is approximately equal to the $V_{TR}$ for the SCR 128, which is depicted at point 222 in FIG. 7. The $V_h$ of the protective circuit 124 is depicted at point 236 and is approximately equal to the sum of the $V_h$ for the SCR 126, which is depicted at point 230 in FIG. 8, and the $V_h$ of the SCR 128, which is depicted at the point 224 of FIG. 7. Thus, the holding voltages for the SCRs 126 and 128, which are connected in series, are cumulative.

Figure 10:
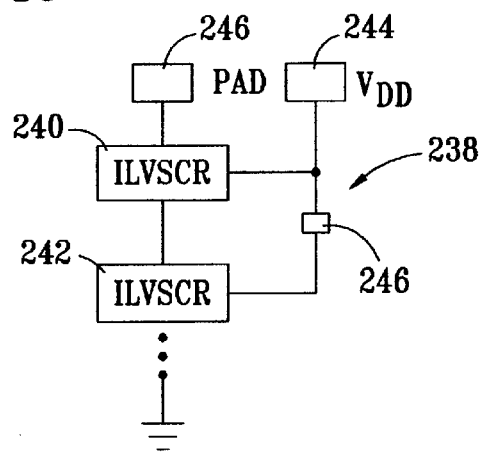
FIG. 10 illustrates an ESD protection circuit of an alternative embodiment of the present invention, in which SCRs of the type depicted in FIGS. 3 and 4 are stacked to provide the protection circuit.

FIG. 10 is a schematic block diagram depicting a protective circuit 238 which includes a plurality of isolated, low voltage SCRs (ILVSCRs), such as the SCR 68 and the SCR 128 of FIGS. 3 and 5, respectively. An ILVSCR 240 is connected in series with an ILVSCR 242. The terminal pads 244 and 246 are connected to the operating power voltage $V_{DD}$ for the integrated circuit in which they are included. The terminal pads 244 and 246 correspond to the terminal pads 70 and 130 of FIGS. 3 and 5, respectively. The terminal pad 248 of the ILVSCR 240 would be connected directly to the signal line to be protected from ESD. The cathode of the ILVSCR 240, which corresponds to the node 88 of FIG. 3, would be connected to the anode of the ILVSCR 242, which corresponds to the anode 132 of FIG. 5. Other ILVSCRs may be included in series. Thus, the protective circuit 238 has a trigger voltage which is equal to the trigger voltage for a singular SCR, such as either of the SCRs 68 or 128, and would have a holding voltage which is equal to the sum of the holding voltages for the SCRs 240 and 242. Thus, the ILVSCRs 240 and 242, along with other SCRs, can be stacked in series, such that the holding voltage for the protective circuit 238 is cumulative.

In summary, there has been provided a protective circuit for protecting against the high voltage of ESD events. The protective circuit has a trigger voltage which is variable and automatically determined by the operating voltage applied to an integrated circuit within which the protected circuit of the present invention is included. The holding voltage of the protective circuit may be increased by selectively connecting a plurality of SCRs in series. Thus, a protective circuit is provided in which the trigger voltage is variable in response to the operating voltage being applied to the circuit, and the holding voltage may be selectively determined.

Although several embodiments of the invention have been described in detail, it should be understood that various changes, substitutions and alterations can be made therein without departing from the spirit and scope of the invention as defined by the appended claims.

What is claimed is:

1. A protective circuit for preventing excessive voltages from being applied through a signal line to a protected circuit, the protective circuit comprising:

an anode connected to the signal line;

a cathode connected to a ground reference;

a P-channel transistor having the source thereof connected to said anode and the gate thereof connected to a trigger voltage separate from the voltage on the signal line;

a PNP transistor having a base, an emitter connected to both said anode line and the source of said P-channel transistor, and further having a collector connected to the drain of said P-channel transistor;

an NPN transistor having the emitter thereof connected to said cathode, the base thereof connected to the collector of said PNP transistor and the drain of said P-channel transistor, and the collector thereof connected to the base of said PNP transistor;

a first resistor connected between said anode and the base of said PNP transistor and the collector of said NPN transistor;

a second resistor connected between said cathode and the collector of said PNP transistor, the drain of said P-channel transistor and the base of said NPN transistor, with said PNP and NPN transistor and said first and second resistors configured as a first SCR;

wherein said P-channel transistor will conduct current through said second resistor to cause the voltage on the base of said NPN transistor to increase thus turning on said NPN transistor and pulling the base of said PNP transistor low to turn on said PNP transistor and latch said first SCR; and a second SCR connected in series with said first SCR, said first and second SCRs having a holding voltage associated therewith, such that a combined holding voltage of said protective circuit is approximately equal to the sum of the holding voltages of each of said first and second SCRs.

2. The protective circuit of claim 1, wherein said first and second SCRs are configured such that said combined trigger voltage if said protective circuit is approximately equal to the trigger voltage of one of said first and second SCRs.

3. The protective circuit of claim 1, wherein at least one of said first and second SCRs are isolated from the other portions of an integrated circuit within which said at least one SCR is included by being disposed within an N-tank disposed within a P substrate.

4. The protective circuit of claim 1, wherein:

the gate of said P-channel transistor is connected to an operating voltage terminal of said protected circuit;

said protective circuit is formed as part of an integrated circuit and contained within a N-tank, which is disposed within a P-type substrate to electrically isolate said protective circuit from other portions of said integrated circuit; and said first and second SCRs are configured such that the trigger voltage of said protective circuit is approximately equal to the trigger voltage of one of said first and second SCRs.

5. A protective circuit for preventing high voltage from being applied through a signal line to a protected circuit, the protective circuit comprising:

a first SCR having a first holding voltage and an associated trigger voltage, a first anode and a first cathode, with said first anode being connected to said signal line;

a second SCR having a second holding voltage and an associated trigger voltage, a second anode and a second cathode, with said second anode being connected to said first cathode of said first SCR such that said first and second SCRs are connected in series; and wherein said protective circuit has a trigger voltage defined by only the trigger voltage of said first SCR and a combined protective circuit holding voltage, with said combined protective circuit holding voltage comprising the cumulative sum of said first and second holding voltages.

6. The protective circuit of claim 5, wherein said combined protective circuit holding voltage is greater than said trigger voltage.

* * * * *